(12) United States Patent
Beaman et al.

(10) Patent No.: US 8,017,470 B2
(45) Date of Patent: Sep. 13, 2011

(54) METHOD OF FORMING A STRUCTURE OVER A SEMICONDUCTOR SUBSTRATE

(75) Inventors: Kevin L. Beaman, Boise, ID (US); John T. Moore, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 12/803,296

(22) Filed: Jun. 23, 2010

(65) Prior Publication Data

US 2010/0267226 A1  Oct. 21, 2010

Related U.S. Application Data

(63) Continuation of application No. 12/145,772, filed on Jun. 25, 2008, now Pat. No. 7,803,678, which is a continuation of application No. 10/757,276, filed on Jan. 14, 2004, now Pat. No. 7,399,714, which is a continuation of application No. 09/602,089, filed on Jun. 22, 2000, now Pat. No. 6,686,298.

(51) Int. Cl.
*H01L 21/8234* (2006.01)

(52) U.S. Cl. ........ 438/216; 438/275; 438/287; 438/775; 257/E21.267

(58) Field of Classification Search ............ 257/E21.267
See application file for complete search history.

(56) References Cited

U.S. PATENT DOCUMENTS

| | | |
|---|---|---|
| 3,627,598 A | 12/1971 | McDonald et al. |
| 4,254,161 A | 3/1981 | Kemlage |
| 4,262,631 A | 4/1981 | Kubacki |
| 4,435,447 A | 3/1984 | Ito et al. |
| 4,605,447 A | 8/1986 | Brotherton et al. |
| 4,882,649 A | 11/1989 | Chen et al. |
| 4,891,684 A | 1/1990 | Nishioka et al. |
| 4,980,307 A | 12/1990 | Ito et al. |
| 4,996,081 A | 2/1991 | Ellul et al. |
| 5,026,574 A | 6/1991 | Economu et al. |
| 5,032,545 A | 7/1991 | Doan et al. |
| 5,051,794 A | 9/1991 | Mori |
| 5,142,438 A | 8/1992 | Reinberg et al. |
| 5,164,331 A | 11/1992 | Lin et al. |
| 5,227,651 A | 7/1993 | Kim et al. |

(Continued)

FOREIGN PATENT DOCUMENTS

EP  0886308 A2  12/1998

(Continued)

OTHER PUBLICATIONS

Doyle, B. et al., "Simultaneous Growth of Different Thickness Gate Oxides in Silicon CMOS Processing", IEEE vol. 16 (7), Jul. 1995, pp. 301-302.

(Continued)

*Primary Examiner* — Stephen W Smoot
(74) *Attorney, Agent, or Firm* — Lerner, David, Littenberg, Krumholz & Mentlik, LLP

(57) ABSTRACT

The invention includes a method of forming a structure over a semiconductor substrate. A silicon dioxide containing layer is formed across at least some of the substrate. Nitrogen is formed within the silicon dioxide containing layer. Substantially all of the nitrogen within the silicon dioxide is at least 10 Å above the substrate. After the nitrogen is formed within the silicon dioxide layer, conductively doped silicon is formed on the silicon dioxide layer.

8 Claims, 5 Drawing Sheets

U.S. PATENT DOCUMENTS

| | | | |
|---|---|---|---|
| 5,237,188 A | 8/1993 | Iwai et al. | |
| 5,254,489 A * | 10/1993 | Nakata | 438/258 |
| 5,258,333 A | 11/1993 | Shappir et al. | |
| 5,318,924 A | 6/1994 | Lin et al. | |
| 5,324,679 A | 6/1994 | Kim et al. | |
| 5,330,920 A | 7/1994 | Soleimani et al. | |
| 5,330,936 A | 7/1994 | Ishitani | |
| 5,334,554 A | 8/1994 | Lin et al. | |
| 5,350,707 A | 9/1994 | Ko et al. | |
| 5,376,593 A | 12/1994 | Sandhu et al. | |
| 5,378,645 A | 1/1995 | Inoue et al. | |
| 5,382,533 A | 1/1995 | Ahmad et al. | |
| 5,393,702 A | 2/1995 | Yang et al. | |
| 5,397,748 A | 3/1995 | Watanabe et al. | |
| 5,398,641 A | 3/1995 | Shih | |
| 5,398,647 A | 3/1995 | Rivera | |
| 5,436,481 A | 7/1995 | Egawa et al. | |
| 5,445,999 A | 8/1995 | Thakur et al. | |
| 5,449,631 A | 9/1995 | Giewont et al. | |
| 5,459,105 A | 10/1995 | Matsuura | |
| 5,464,792 A | 11/1995 | Tseng et al. | |
| 5,498,890 A | 3/1996 | Kim et al. | |
| 5,500,380 A | 3/1996 | Kim | |
| 5,504,029 A | 4/1996 | Murata et al. | |
| 5,508,542 A | 4/1996 | Geiss et al. | |
| 5,518,946 A | 5/1996 | Kuroda | |
| 5,518,958 A | 5/1996 | Giewont et al. | |
| 5,523,596 A | 6/1996 | Ohi et al. | |
| 5,596,218 A | 1/1997 | Soleimani et al. | |
| 5,612,558 A | 3/1997 | Harshfield | |
| 5,619,057 A | 4/1997 | Komatsu | |
| 5,620,908 A | 4/1997 | Inoh et al. | |
| 5,633,036 A | 5/1997 | Seebauer et al. | |
| 5,663,036 A | 9/1997 | Conley et al. | |
| 5,663,077 A | 9/1997 | Adachi et al. | |
| 5,674,788 A | 10/1997 | Wristers et al. | |
| 5,685,949 A | 11/1997 | Yashima | |
| 5,716,864 A | 2/1998 | Abe | |
| 5,719,083 A | 2/1998 | Komatsu | |
| 5,731,235 A | 3/1998 | Srinivasan et al. | |
| 5,760,475 A | 6/1998 | Cronin et al. | |
| 5,763,922 A | 6/1998 | Chau | |
| 5,821,142 A | 10/1998 | Sung et al. | |
| 5,834,372 A | 11/1998 | Lee | |
| 5,837,592 A | 11/1998 | Chang et al. | |
| 5,837,598 A | 11/1998 | Aronowitz et al. | |
| 5,840,610 A | 11/1998 | Gilmer et al. | |
| 5,844,771 A | 12/1998 | Graettinger et al. | |
| 5,851,603 A | 12/1998 | Tsai et al. | |
| 5,861,651 A | 1/1999 | Brasen et al. | |
| 5,882,978 A | 3/1999 | Srinivasan et al. | |
| 5,885,877 A | 3/1999 | Gardner et al. | |
| 5,897,354 A | 4/1999 | Kachelmeier | |
| 5,920,779 A | 7/1999 | Sun et al. | |
| 5,939,750 A | 8/1999 | Early | |
| 5,960,289 A | 9/1999 | Tsui et al. | |
| 5,960,302 A | 9/1999 | Ma et al. | |
| 5,969,397 A | 10/1999 | Grider, III et al. | |
| 5,970,345 A | 10/1999 | Hattangady et al. | |
| 5,972,783 A | 10/1999 | Arai et al. | |
| 5,972,800 A | 10/1999 | Hasegawa | |
| 5,981,366 A | 11/1999 | Koyama et al. | |
| 5,994,749 A | 11/1999 | Oda | |
| 5,998,253 A | 12/1999 | Loh et al. | |
| 6,001,741 A | 12/1999 | Alers | |
| 6,001,748 A | 12/1999 | Tanaka et al. | |
| 6,008,104 A | 12/1999 | Schrems | |
| 6,015,739 A | 1/2000 | Gardner et al. | |
| 6,033,998 A | 3/2000 | Aronowitz et al. | |
| 6,040,249 A | 3/2000 | Holloway | |
| 6,051,865 A | 4/2000 | Gardner et al. | |
| 6,054,396 A | 4/2000 | Doan | |
| 6,057,200 A | 5/2000 | Prall et al. | |
| 6,057,220 A | 5/2000 | Ajmera et al. | |
| 6,057,584 A | 5/2000 | Gardner et al. | |
| 6,060,406 A | 5/2000 | Alers et al. | |
| 6,063,713 A | 5/2000 | Doan | |
| 6,077,754 A | 6/2000 | Srinivasan et al. | |
| 6,080,629 A | 6/2000 | Gardner et al. | |
| 6,080,682 A | 6/2000 | Ibok | |
| 6,087,229 A | 7/2000 | Aronowitz et al. | |
| 6,087,236 A | 7/2000 | Chau et al. | |
| 6,091,109 A | 7/2000 | Hasegawa | |
| 6,091,110 A | 7/2000 | Hebert et al. | |
| 6,093,661 A * | 7/2000 | Trivedi et al. | 438/769 |
| 6,096,597 A | 8/2000 | Tsu et al. | |
| 6,100,163 A | 8/2000 | Jang et al. | |
| 6,110,780 A | 8/2000 | Yu et al. | |
| 6,110,842 A | 8/2000 | Okuno et al. | |
| 6,111,744 A | 8/2000 | Doan | |
| 6,114,203 A * | 9/2000 | Ghidini et al. | 438/258 |
| 6,136,636 A | 10/2000 | Wu | |
| 6,140,187 A | 10/2000 | DeBusk et al. | |
| 6,146,948 A | 11/2000 | Wu et al. | |
| 6,150,226 A | 11/2000 | Reinberg | |
| 6,168,980 B1 | 1/2001 | Yamazaki et al. | |
| 6,171,900 B1 | 1/2001 | Sun | |
| 6,174,821 B1 | 1/2001 | Doan | |
| 6,184,110 B1 | 2/2001 | Ono et al. | |
| 6,197,701 B1 | 3/2001 | Shue et al. | |
| 6,201,303 B1 | 3/2001 | Ngo et al. | |
| 6,207,532 B1 | 3/2001 | Lin et al. | |
| 6,207,586 B1 | 3/2001 | Ma et al. | |
| 6,207,985 B1 | 3/2001 | Walker | |
| 6,225,167 B1 | 5/2001 | Yu et al. | |
| 6,228,701 B1 | 5/2001 | Dehm et al. | |
| 6,232,244 B1 | 5/2001 | Ibok | |
| 6,245,616 B1 | 6/2001 | Buchanan et al. | |
| 6,255,703 B1 | 7/2001 | Hause et al. | |
| 6,265,327 B1 | 7/2001 | Kobayashi et al. | |
| 6,268,296 B1 | 7/2001 | Misium et al. | |
| 6,274,442 B1 | 8/2001 | Gardner et al. | |
| 6,297,162 B1 | 10/2001 | Jang et al. | |
| 6,323,114 B1 | 11/2001 | Hattangady et al. | |
| 6,323,138 B1 | 11/2001 | Doan | |
| 6,331,492 B2 | 12/2001 | Misium et al. | |
| 6,348,420 B1 | 2/2002 | Raaijmakers et al. | |
| 6,350,707 B1 | 2/2002 | Liu et al. | |
| 6,362,085 B1 | 3/2002 | Yu et al. | |
| 6,393,981 B1 | 5/2002 | Cameron | |
| 6,399,445 B1 | 6/2002 | Hattangady et al. | |
| 6,399,448 B1 | 6/2002 | Mukhopadhyay et al. | |
| 6,399,520 B1 | 6/2002 | Kawakami et al. | |
| 6,410,991 B1 | 6/2002 | Kawai et al. | |
| 6,413,881 B1 | 7/2002 | Aronowitz et al. | |
| 6,436,771 B1 | 8/2002 | Jang et al. | |
| 6,450,116 B1 | 9/2002 | Noble et al. | |
| 6,482,690 B2 | 11/2002 | Shibata | |
| 6,492,690 B2 | 12/2002 | Ueno et al. | |
| 6,649,538 B1 | 11/2003 | Cheng et al. | |
| 6,649,543 B1 | 11/2003 | Moore | |
| 6,653,184 B2 | 11/2003 | Moore | |
| 6,660,657 B1 | 12/2003 | Sandhu et al. | |
| 6,660,658 B2 | 12/2003 | Sandhu et al. | |
| 6,682,979 B2 | 1/2004 | Moore | |
| 6,686,298 B1 | 2/2004 | Beaman et al. | |
| 6,690,046 B2 | 2/2004 | Beaman et al. | |
| 6,723,599 B2 | 4/2004 | Eppich et al. | |
| 6,875,707 B2 | 4/2005 | Moore et al. | |
| 6,878,585 B2 | 4/2005 | Moore et al. | |
| 6,891,215 B2 | 5/2005 | Moore et al. | |
| 6,893,981 B2 | 5/2005 | Park et al. | |
| 7,153,736 B2 | 12/2006 | Eppich et al. | |
| 7,153,746 B2 | 12/2006 | Moore et al. | |
| 7,371,647 B2 | 5/2008 | Beaman et al. | |
| 7,399,714 B2 | 7/2008 | Beaman et al. | |
| 7,803,678 B2 * | 9/2010 | Beaman et al. | 438/216 |
| 2001/0036752 A1 | 11/2001 | Deboer et al. | |
| 2002/0009861 A1 | 1/2002 | Narwankar et al. | |
| 2002/0052124 A1 | 5/2002 | Raaijmakers et al. | |
| 2002/0094620 A1 | 7/2002 | Sandhu et al. | |
| 2002/0094621 A1 | 7/2002 | Sandhu et al. | |
| 2002/0098710 A1 | 7/2002 | Sandhu et al. | |
| 2002/0182812 A1 | 12/2002 | Sandhu et al. | |
| 2003/0034518 A1 | 2/2003 | Yoshikawa | |

| | | |
|---|---|---|
| 2005/0087820 A1 | 4/2005 | Bai et al. |
| 2005/0167727 A1 | 8/2005 | Moore et al. |
| 2006/0134864 A1 | 6/2006 | Higashitani et al. |

FOREIGN PATENT DOCUMENTS

| | | |
|---|---|---|
| JP | 2001237243 A | 8/2001 |
| WO | 9639713 A1 | 12/1996 |
| WO | 2003049159 A2 | 6/2003 |

OTHER PUBLICATIONS

Ko, L. et al., "The Effect of Nitrogen Incorporation into the Gate Oxide by Using Shallow Implantation of Nitrogen and Drive-In Process", IEEE 1996, pp. 32-35.

Kuroi et al., "The Effects of Nitrogen Implantation Into P+ Poly-Silicon Gate on Gate Oxide Properties", 1994 Symposium on VLSI Technology Digest of Technical Papers, pp. 107-108.

Liu et al., "Multiple gate oxide thickness for 2GHz system-on-a-chip technologies", 1998 IEEE, pp. 21.2.1-21.2.4.

Luo et al., "Effect of H2 Content on Reliability of Ultrathin In-Situ Steam Generated (ISSG) SiO2", IEEE, Device Letters, vol. 21, No. 9, Sep. 2000, pp. 430-432.

Millman, "Microelectronics: Digital and Analog Circuits and Systems", 1979, McGraw-Hill Inc., pp. 91-92.

U.S. Appl. No. 09/653,281, filed Aug. 31, 2000, Beaman et al.

WO PCT/US2002/038233 Nov. 2002, Search Report.

Wolf, "Silicon Processing for the VLSI Era", vol. 2: Process Integration, 1990, pp. 188-189, 194-195, 609-614.

Wolf, S., "Silicon Processing for the VLSI Era", Lattice Press 1990, vol. 2, pp. 212-213.

Wolf, Stanley, Silicon Processing for the VLSI Era (1995), V.3, 648-9.

\* cited by examiner

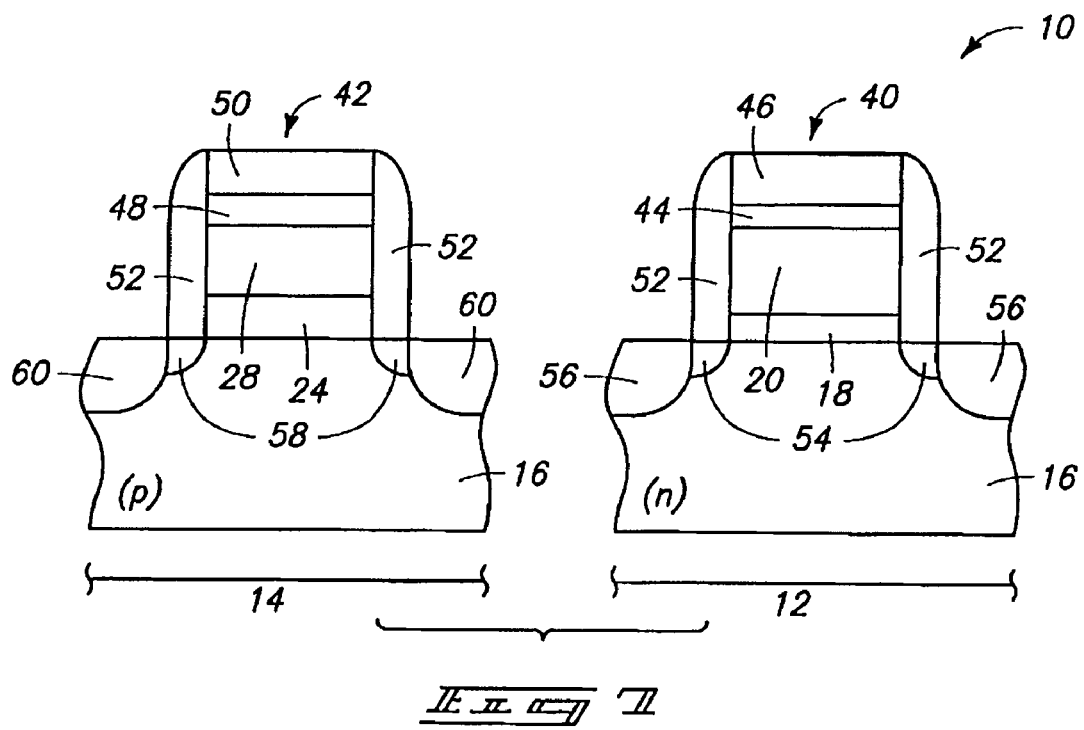
_Fig. 7_
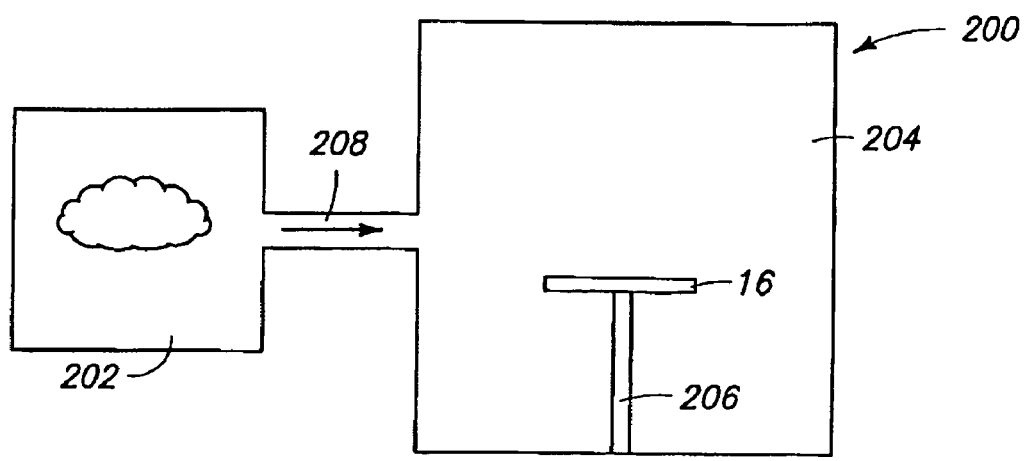
_Fig. 8_

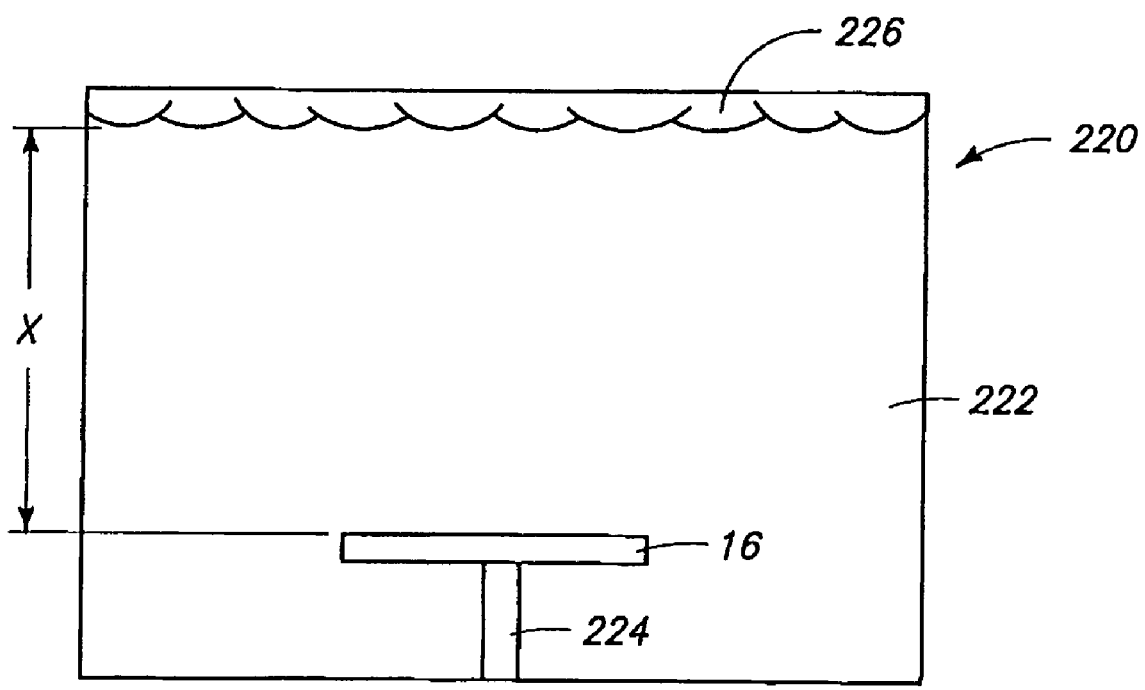

METHOD OF FORMING A STRUCTURE OVER A SEMICONDUCTOR SUBSTRATE

RELATED PATENT DATA

This application is a continuation of U.S. patent application Ser. No. 12/145,772, filed Jun. 25, 2008, now U.S. Pat. No. 7,803,678, which is a continuation of U.S. patent application Ser. No. 10/757,276, filed Jan. 14, 2004, now issued U.S. Pat. No. 7,399,714, which is a continuation of U.S. patent application Ser. No. 09/602,089, filed Jun. 22, 2000, now issued U.S. Pat. No. 6,686,298, entitled "Methods of Forming Structures over Semiconductor Substrates, and Methods of Forming Transistors Associated with Semiconductor Substrates", naming Kevin L. Beaman and John T. Moore as inventors, the disclosures of which are hereby incorporated herein by reference.

TECHNICAL FIELD

The invention pertains to methods of forming structures over semiconductor substrates, and in particular embodiments pertains to methods of forming transistors associated with semiconductor substrates. The invention also pertains to semiconductor assemblies.

BACKGROUND OF THE INVENTION

There are numerous applications in semiconductor processing in which it is desired to form conductive layers over oxides. For instance, transistor structures frequently comprise conductive layers formed over silicon dioxide (commonly referred to as a gate oxide). In some instances, the conductive materials comprise conductively doped silicon, and in such instances dopant can occasionally migrate through the oxide into an underlying substrate. In particular transistor devices, such dopant migration can be problematic. For instance, PMOS devices comprise an n-type channel region underneath a gate oxide, and can comprise p-type doped silicon over the gate oxide. If p-type dopant migrates from the silicon, through the oxide, and into the underlying substrate it will change the doping within the n-type channel. Such change can affect, and even destroy, electrical properties of the transistor. Accordingly, it can be desired to alleviate dopant migration relative to PMOS devices.

In contrast to the above-discussed problems which can be associated with PMOS devices, dopant migration is typically not problematic relative to NMOS devices. However, NMOS devices can have their own associated problems. For instance, it can be desired to form gate oxide for NMOS devices which is thicker than that utilized for PMOS devices. Such can be problematic in semiconductor wafer processing, in that both NMOS devices and PMOS devices are frequently formed over the same wafer. It would be desired to develop methodology which enables different gate oxide thicknesses to be associated with different transistors on the same wafer, and in particular applications desired to develop methodology to enable NMOS transistors to have thicker gate oxide than PMOS transistors.

SUMMARY OF THE INVENTION

In one aspect, the invention encompasses a method of forming a structure over a semiconductor substrate. A silicon dioxide containing layer is formed across at least some of the substrate. Nitrogen is formed within the silicon dioxide containing layer. Substantially all of the nitrogen within the silicon dioxide is at least 10 Å above the substrate. After the nitrogen is formed within the silicon dioxide layer, conductively doped silicon is formed on the silicon dioxide layer.

In another aspect, the invention encompasses a method of forming a pair of transistors associated with a semiconductor substrate. First and second regions of the substrate are defined. A first oxide region is formed to cover at least some of the first region of the substrate, and to not cover the second region of the substrate. Nitrogen is formed within the first oxide region. After the nitrogen is formed, a first conductive layer is formed over the first oxide region. The first conductive layer does not cover the second region of the substrate. After the first conductive layer is formed, a second oxide region is formed over the second region of the substrate. A second conductive layer is formed over the second oxide region. The first conductive layer is patterned into a first transistor gate, and the second conductive layer is patterned into a second transistor gate. First source/drain regions are formed proximate the first transistor gate, and the second source/drain regions are formed proximate the second transistor gate.

In other aspects, the invention pertains to semiconductor assemblies.

BRIEF DESCRIPTION OF THE DRAWINGS

Preferred embodiments of the invention are described below with reference to the following accompanying drawings.

FIG. 7 is a view of the FIG. 1 wafer fragments shown at a processing step subsequent to that of FIG. 6.

FIG. 8 is a diagrammatic, cross-sectional view of an apparatus which can be utilized in methodology of the present invention.

FIG. 9 is a diagrammatic, cross-sectional view of another apparatus which can be utilized in methodology of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
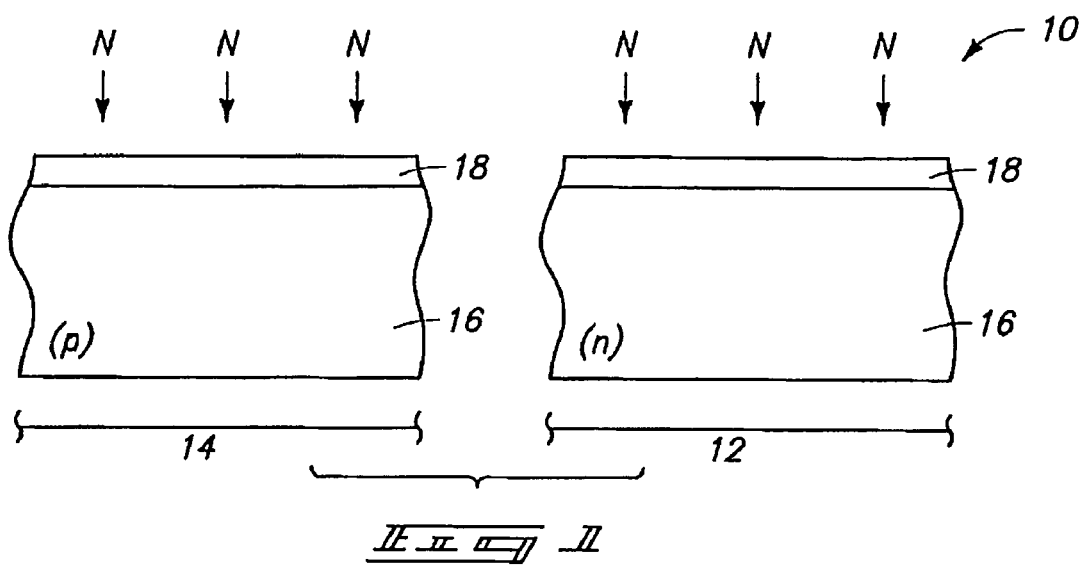
FIG. 1 is a diagrammatic, cross-sectional view of semiconductor wafer fragments at a preliminary processing step of a method of the present invention.

FIG. 1 shows a semiconductor wafer 10 at a preliminary processing step of the present invention. Wafer 10 comprises a substrate 16 which is divided into a first region 12 and a second region 14. Substrate 16 can comprise, for example, monocrystalline silicon lightly doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Regions 12 and 14 can correspond to differently-doped regions of substrate 16. For instance, region 12 can correspond to a portion of substrate 16 having a heavier concentration of n-type conductivity enhancing dopant than p-type conductivity enhancing dopant, and can accordingly be referred to as an n-type doped region. Further, region 14 can correspond to a region of substrate 16 wherein the p-type dopant concentration is heavier than any n-type dopant concentration, and can accordingly be referred to as a p-type region of substrate 10. In order to emphasize this aspect of the invention and assist in the description that follows, substrate 16 of region 12 is labeled with an "n", and region 14 is labeled with a "p". It is to be understood that the shown doping of regions 12 and 14 corresponds to a particular embodiment of the present invention, and that other embodiments are encompassed wherein both of regions 12 and 14 are similarly doped, including embodiments wherein regions 12 and 14 are both heavier doped with n-type dopant than p-type dopant, as well as embodiments wherein regions 12 and 14 are both heavier doped with p-type dopant than n-type dopant.

In particular embodiments of the present invention, regions 12 and 14 correspond to portions of a semiconductor memory assembly, and in such embodiments regions 12 and 14 can both correspond to memory array regions, or can both correspond to regions peripheral to a memory array regions, or alternatively one of regions 12 and 14 can correspond to a memory array region while the other regions 12 and 14 corresponds to a portion of the wafer peripheral to the memory array region.

An oxide layer 18 is formed over substrate 16. Oxide layer 18 can comprise, for example, silicon dioxide and can be formed by chemical vapor deposition over layer 16. Alternatively, if substrate 16 comprises silicon (such as, for example, if substrate 16 is monocrystalline silicon) a silicon dioxide layer 18 can be formed by oxidizing an upper surface of substrate 16.

Nitrogen is shown being dispersed onto and within layer 18. The nitrogen is preferably formed primarily at a surface of oxide layer 18. Layer 18 is preferably less than 50 last 10 Å above substrate 16. Alternatively, substantially all of the nitrogen formed within layer 18 is preferably at least 10 Å above substrate 16. For purposes of interpreting this document and the claims that follow, it is to be understood that the reference to "substantially all" of the nitrogen within silicon dioxide layer 18 being at least 10 Å above substrate 16 is defined to indicate that no measurable amount of nitrogen is in the portion of layer that is within 10 Å of substrate 16. In particular embodiments of the present invention, substantially all of the nitrogen formed within layer 18 is formed within the top 10 Å of layer 18. In other words, no measurable amount of nitrogen extends below the top 10 Å of layer 18, which can, in particular embodiments, indicate that an entirety of the nitrogen is within the top 10 Å of layer 18.

FIGS. 8 and 9 illustrate apparatuses which can be utilized for forming nitrogen within only the upper portions of silicon dioxide layer 18. Referring to FIG. 8, nitrogen-comprising region 22 can be formed by remote plasma nitridization utilizing an apparatus 200. Apparatus 200 comprises a plasma chamber 202 and a reaction chamber 204. Reaction chamber 204 comprises a substrate holder 206, and substrate 16 is supported within chamber 204 by holder 206. Preferably, holder 206 is configured to rotate substrate 16 during exposure of substrate 16 to activated nitrogen species. Such activated nitrogen species are formed within plasma chamber 202 by, for example, exposing $N_2$ and/or other nitrogen-containing materials (such as $N_2O$ or $NH_3$) to plasma conditions, with the term "activated" indicating that the nitrogen species is different than the form of nitrogen fed to the plasma. An activated nitrogen species can comprise, for example, a nitrogen ion or a nitrogen atom in an energy state higher than its ground state. Exemplary plasma conditions comprise utilization of a microwave plasma generator at a power of from about 1,500 watts to about 3,000 watts, and utilizing a pressure within chamber 202 of less than or equal to about 3 Torr. The plasma of chamber 202 forms activated nitrogen species which migrate along a passageway 208 into chamber 204 whereupon the species can form a nitrogen-comprising layer over and within oxide 18 (FIG. 1).

An arrow is shown within passageway 208 to indicate migration of plasma activated nitrogen species through passageway 208. Preferably, passageway 208 is of sufficient length so that plasma 202 is at least about 12 inches from substrate 16. Such can enable highly activated nitrogen species formed within a plasma to relax prior to interaction with substrate 16, which can limit penetration of the nitrogen species into substrate 16 relative to an amount of penetration which would occur with more highly activated species. In order to further limit penetration of nitrogen species into substrate 16, substrate 16 is preferably not biased relative to the plasma within chamber 202.

Suitable operating conditions for forming a nitrogen-comprising plasma over substrate 16 can include maintaining a temperature of substrate 16 at from about 550° C. to about 1,000° C., rotating the wafer at about 90 rotations per minute (RPM), maintaining a pressure within chambers 202 and 204 of from about 0.8 Torr to about 2.8 Torr, and exposing the wafer to the nitridization conditions for from about one minute to about five minutes.

An alternative apparatus which can be utilized for forming nitrogen over and within oxide layer 18 (FIG. 1) is described with reference to FIG. 9 as apparatus 220. Apparatus 220 can be referred to as a high density plasma remote plasma nitridization (HDP-RPN) apparatus, or simply as a plasma nitridization (PN) apparatus. Apparatus 220 comprises a reaction chamber 222 having a wafer holder 224 therein. Wafer 16 is supported on holder 224. A plasma 226 is formed above substrate 16, and preferably is maintained a distance "X" from substrate 16, with distance "X" corresponding to at least about four inches. Nitrogen is introduced into plasma 226 in the form of, for example, $N_2$, and activated nitrogen species are formed from the nitrogen. Suitable processing parameters for utilization of the apparatus of FIG. 9 include a wafer temperature of from 0° C. to 400° C., no rotation of the substrate 16, a pressure within chamber 222 of from about 5 mTorr to about 15 mTorr (preferably of from about 5 mTorr to about 10 mTorr), and an exposure time of substrate 16 to activated nitrogen species within chamber 222 of from about 5 seconds to about 30 seconds.

Figure 2:
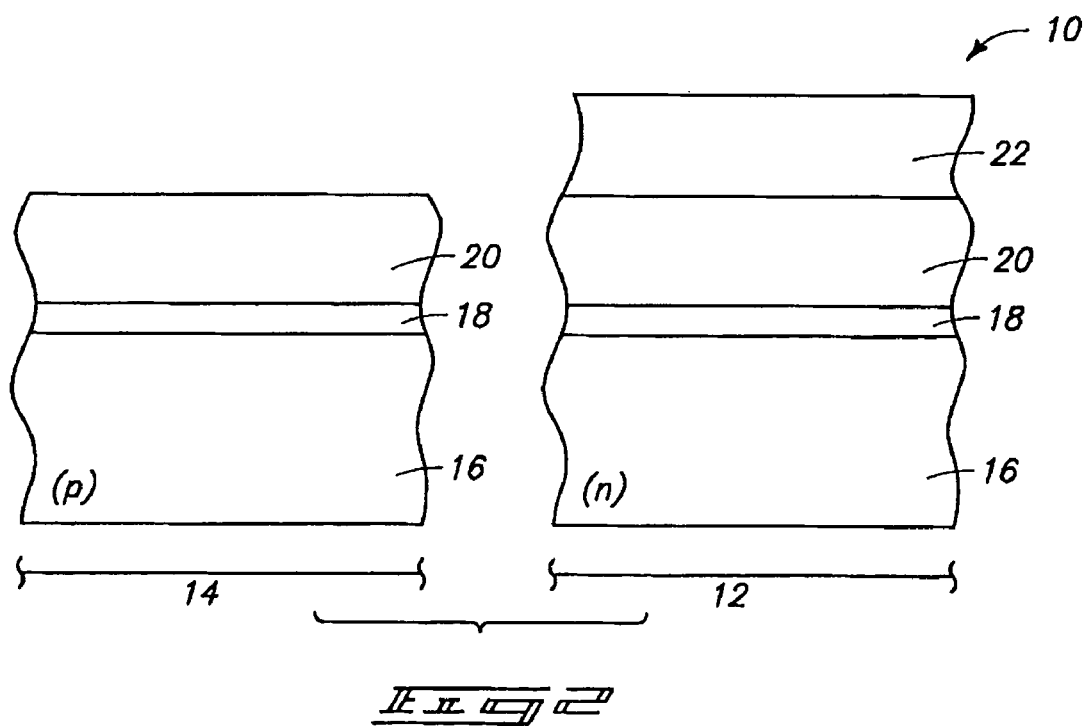
FIG. 2 is a view of the FIG. 1 wafer fragments shown at a processing step subsequent to that of FIG. 1.

Referring next to FIG. 2, a conductive layer 20 is formed over oxide 18, and a patterned masking layer 22 is formed over the portion of conductive layer 20 that is associated with region 12, while the portion of conductive layer 20 associated with region 14 remains exposed.

Conductive material 20 can comprise, for example, conductively doped silicon, such as, for example, conductively doped amorphous or polycrystalline silicon. In particular embodiments of the present invention, conductive layer 20 comprises p-type doped silicon. Conductive material 20 can also comprise metals, and/or silicides, in addition to, or alternatively to, the conductively doped silicon.

Masking layer 22 can comprise, for example, photoresist, and can be patterned by photolithographic processing.

Figure 3:
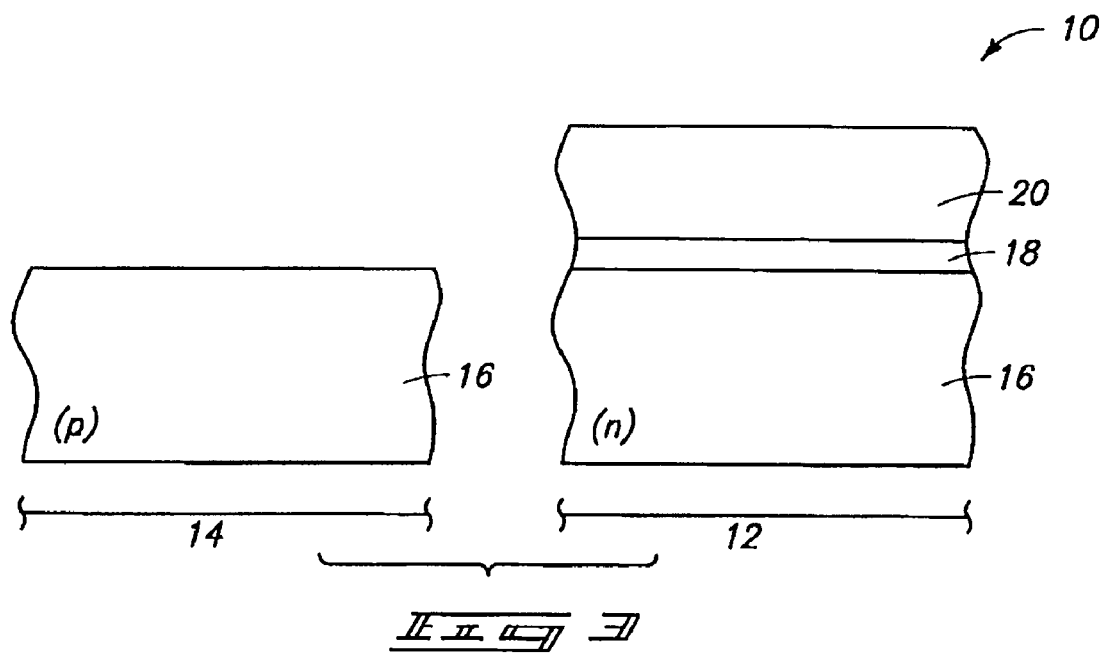
FIG. 3 is a view of the FIG. 1 wafer fragments shown at a processing step subsequent to that of FIG. 2.

Referring to FIG. 3, wafer fragment 10 is shown after being exposed to etching conditions which remove layers 20 and 18 from over region 14 of substrate 16. Masking layer 22 (FIG. 2) protects layers 18 and 20 from being removed over region 12 of substrate 16. In embodiments in which oxide 18 comprises silicon dioxide and conductive material 20 comprises conductively doped silicon, a suitable etchant for removing materials 18 and 20 from over substrate 16 can comprise, for example, $CF_4$ and $O_2$.

It is noted that the structure shown in FIG. 3 can be obtained through processing methods other than that shown in FIGS. 1-3. For instance, region 14 can be covered during formation of oxide layer 18 and conductive layer 20, and subsequently the cover removed from over region 14 to form a structure identical to that shown in FIG. 3.

Figure 4:
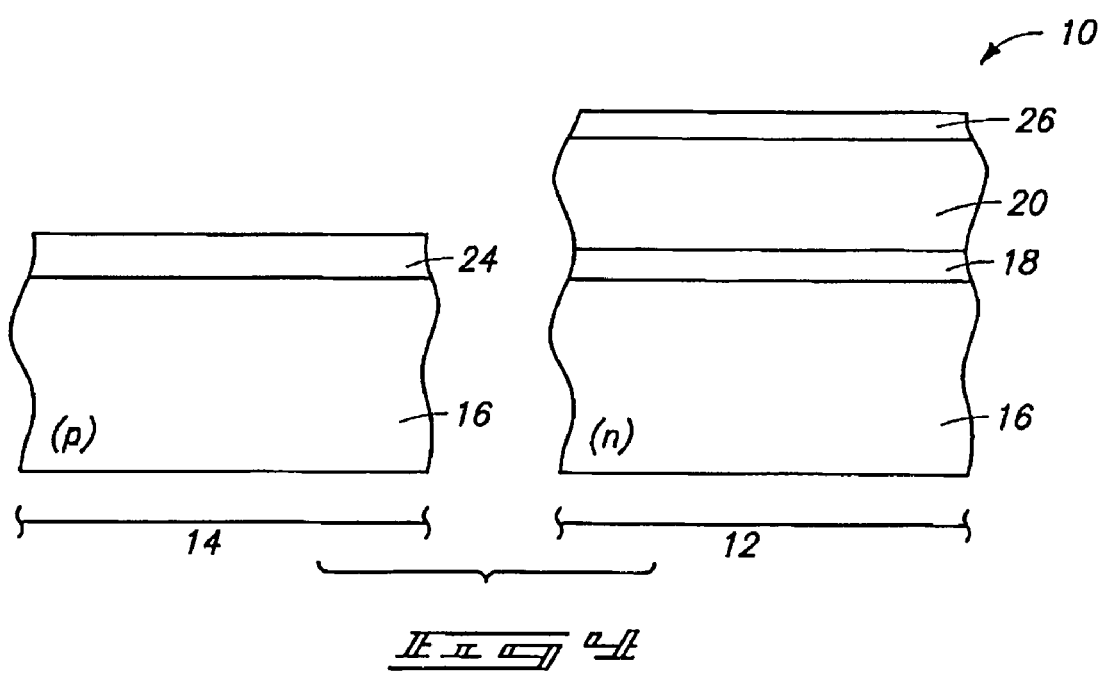
FIG. 4 is a view of the FIG. 1 wafer fragments shown at a processing step subsequent to that of FIG. 3.

Referring to FIG. 4, wafer 10 is shown after being exposed to oxidizing conditions. The oxidizing conditions form an oxide layer 24 over substrate 16, and also form an oxide layer over conductive material 20. If substrate 16 comprises monocrystalline silicon and conductive material 20 comprises conductively doped silicon, oxide layers 24 and 26 will comprise silicon dioxide. Oxide layers 24 and 26 can be formed by methods other than oxidation of layer 20 and substrate 16, such as, for example, by chemical vapor deposition of silicon dioxide. Also, it is noted that the invention encompasses embodiments wherein oxide is not formed over layer 20, such as, for example, embodiments in which oxide layer 24 is formed by oxidation of substrate 16 and in which layer 20 comprises a non-oxidizable material.

Oxide layer 24 can be formed to be a different thickness than oxide layer 18. For instance, oxide layer 18 can be optimized for formation of a PMOS transistor, and accordingly can be less than 50 Å thick, and, for example, about 40 Å thick, while oxide layer 24 can be optimized for formation of an NMOS transistor, and accordingly can be greater than 50 Å thick, and, for example, can be about 70 Å thick.

Figure 5:
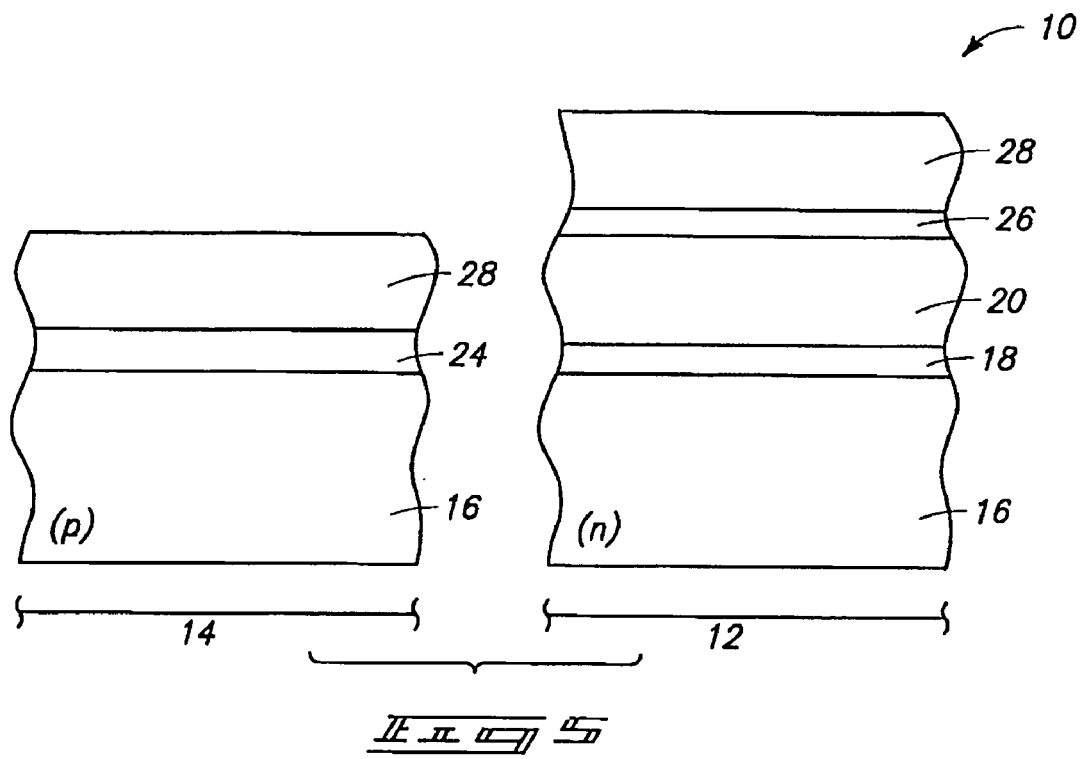
FIG. 5 is a view of the FIG. 1 wafer fragments shown at a processing step subsequent to that of FIG. 4.

Referring to FIG. 5, a second conductive material 28 is formed over regions 12 and 14 of substrate 16. Conductive material 28 can comprise, for example, conductively doped silicon, and in particular embodiments comprises n-type doped silicon. Conductive material 28 can comprise other conductive materials in addition to, or alternatively to, conductively doped silicon, such as, for example, metals and/or silicides.

Figure 6:
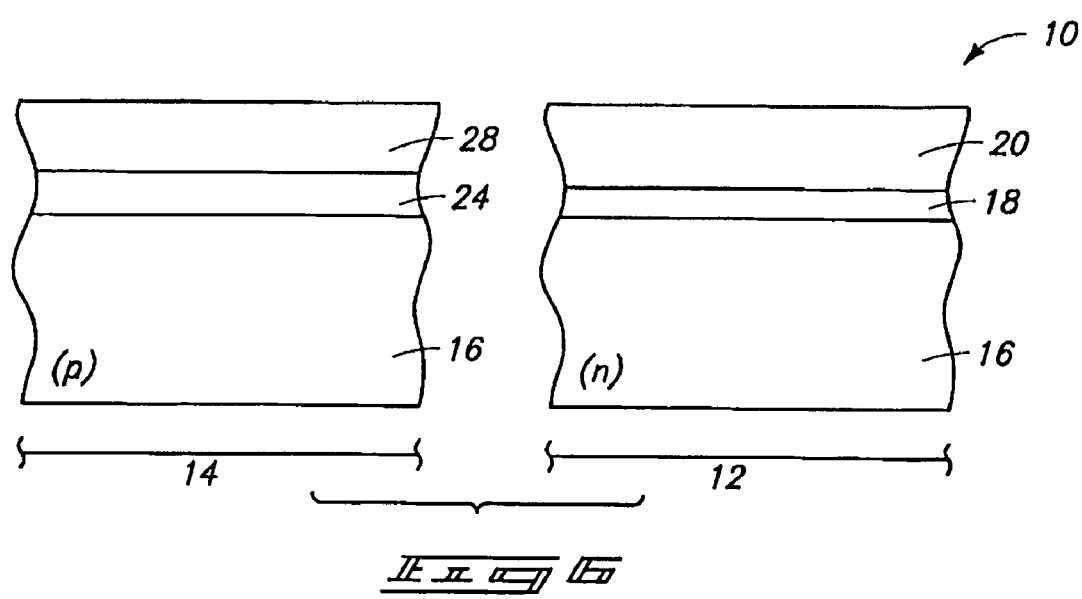
FIG. 6 is a view of the FIG. 1 wafer fragments shown at a processing step subsequent to that of FIG. 5.

Referring to FIG. 6, wafer 10 is exposed to planarizing conditions which planarize an upper surface of wafer 10 and remove layers 26 and 28 from over first conductive layer 20. Exemplary planarizing conditions comprise chemical-mechanical polishing. Alternatively or in combination with the chemical-mechanical polishing, a polysilicon dry etch can be utilized to remove polysilicon from over both of regions 12 and 14. A suitable polysilicon dry etch is an isotropic etch utilizing HBr.

Referring to FIG. 7, layers 18 and 20 are incorporated into a first transistor structure 40 and layers 24 and 28 are incorporated into a second transistor structure 42.

First transistor structure 40 comprises a silicide layer 44 and an insulative layer 46 which are formed over layers 18 and 20 and patterned together with layers 18 and 20 to form a gate structure. Silicide layer 44 can comprise, for example, titanium silicide or tungsten silicide.

Second transistor structure 42 comprises a silicide layer 48 and insulative layer 50 which are formed over layers 24 and 28 and patterned with layers 24 and 28 to form a gate structure. Silicide layer 48 can comprise, for example, titanium silicide or tungsten silicide, and insulative layer 50 can comprise, for example, silicon nitride.

Sidewall spacers 52 are shown formed along sidewalls of patterned materials 24, 28, 48 and 50, as well as along sidewalls of patterned materials 18, 20, 44 and 46. Spacers 52 comprise insulative materials, and can comprise, for example, silicon dioxide or silicon nitride.

It is noted that although conductive layers 44 and 48 are shown separately from conductive materials 20 and 28, silicides 44 and 48 could also have been incorporated into conductive materials 20 and 28, respectively. In other words, conductive material 20 could, in particular embodiments, encompass two layers, with a lower layer comprising conductively doped silicon and an upper layer comprising a silicide; and similarly conductive material 28 could, in particular embodiments, encompass two layers with a lower layer comprising conductively doped silicon and an upper layer comprising a silicide.

Lightly doped diffusion (Ldd) regions 54 are shown within region 12 of substrate 16, and source/drain regions 56 are also shown within region 12 of substrate 16. Source/drain regions 56 comprise p-type dopant and together with Ldd regions 54 and layers 18, 20, 44 and 46 define a PMOS transistor 40. Lightly doped diffusion regions 54 typically comprise p-type dopant.

Lightly doped diffusion regions 58 are shown within region 14 of substrate 16 and heavily doped source/drain regions 60 are also shown within region 14 of substrate 16. Heavily doped source/drain regions 60 comprise n-type dopant, and together with layers 24, 28, 48 and 50 define NMOS transistor 42. Lightly doped diffusion regions 58 typically comprise n-type dopant.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a structure over a semiconductor substrate, the method comprising:
   providing the semiconductor substrate, the substrate comprising a first region and a second region, the first region comprising a differently-doped region than the second region;
   forming a first oxide layer over the first and second regions;
   exposing the first oxide layer to an activated nitrogen species formed from plasma conditions to provide nitrogen into at least a portion of the first oxide layer over the first region;
   forming a first conductive layer over the first oxide layer and over the first and second regions;
   forming a second oxide layer over the first and second regions;
   forming a second conductive layer over the first and second regions; and
   removing the first conductive layer from over the second region before the forming of the second oxide layer and the second conductive layer.

2. The method of claim 1 wherein the forming of the second oxide layer comprises forming the second oxide layer against the first conductive layer.

3. A method of forming a structure over a semiconductor substrate, the method comprising:
   providing the semiconductor substrate, the substrate comprising a first region and a second region, the first region comprising a different area of the substrate than the second region;
   providing a first oxide layer over the first region, the first oxide layer comprising a first thickness extending generally perpendicularly relative the substrate;
   providing a second oxide layer over the second region, the second oxide layer comprising a second thickness extending generally perpendicularly relative the substrate, the second thickness being greater than the first thickness of the first oxide layer;
   exposing the first oxide layer to an activated nitrogen species formed from plasma conditions to provide nitrogen into the first oxide layer; and
   providing a conductive layer against the first and second oxide layers, the conductive layer comprising a thickness extending generally perpendicularly relative the substrate, the thickness of the conductive layer over the first region being substantially equal to the thickness of the conductive layer over the second region,
   wherein the first oxide layer further comprises an upper portion and a lower portion, the upper portion comprising an upper surface and being spaced from the semiconductor substrate by the lower portion, and wherein the providing of the nitrogen comprises providing substantially all of the nitrogen within the upper portion.

4. A method of forming a structure over a semiconductor substrate, the method comprising:
   providing the semiconductor substrate, the substrate comprising a first region and a second region, the first region comprising a different area of the substrate than the second region;
   providing a first oxide layer over the first region, the first oxide layer comprising a first thickness extending generally perpendicularly relative the substrate;
   providing a second oxide layer over the second region, the second oxide layer comprising a second thickness extending generally perpendicularly relative the substrate, the second thickness being greater than the first thickness of the first oxide layer;
   exposing the first oxide layer to an activated nitrogen species formed from plasma conditions to provide nitrogen into the first oxide layer; and
   providing a conductive layer against the first and second oxide layers, the conductive layer comprising a thickness extending generally perpendicularly relative the substrate, the thickness of the conductive layer over the first region being substantially equal to the thickness of the conductive layer over the second region,
   wherein the first oxide layer further comprises an upper portion and a lower portion, the upper portion comprising an upper surface and being spaced from the semiconductor substrate by the lower portion, and wherein the providing of the nitrogen comprises no measurable amount of the nitrogen within the lower portion.

5. The method of claim 4 wherein the lower portion of the first oxide layer comprises a thickness of about 10 angstroms.

6. The method of claim 4, wherein the upper portion of the first oxide layer comprises a thickness of about 10 angstroms.

7. A method of forming a structure over a semiconductor substrate, the method comprising:
   providing the semiconductor substrate, the substrate comprising a first region and a second region, the first region comprising a different area of the substrate than the second region;
   providing a first oxide layer over the first region, the first oxide layer comprising a first thickness extending generally perpendicularly relative the substrate;
   providing a second oxide layer over the second region, the second oxide layer comprising a second thickness extending generally perpendicularly relative the substrate, the second thickness being greater than the first thickness of the first oxide layer;
   exposing the first oxide layer to an activated nitrogen species formed from plasma conditions to provide nitrogen into the first oxide layer; and
   providing a conductive layer against the first and second oxide layers, the conductive layer comprising a thickness extending generally perpendicularly relative the substrate, the thickness of the conductive layer over the first region being substantially equal to the thickness of the conductive layer over the second region,
   wherein the providing of the nitrogen comprises:
      forming an activated nitrogen species comprising a first energy state,
      changing the first energy state of the activated nitrogen species to a second energy state that is different from the first energy state, and
      exposing the first oxide layer to the activated nitrogen species at the second energy state.

8. The method of claim 7 wherein the second energy state is a energy state than the first energy state.

* * * * *

UNITED STATES PATENT AND TRADEMARK OFFICE
CERTIFICATE OF CORRECTION

PATENT NO. : 8,017,470 B2  
APPLICATION NO. : 12/803296  
DATED : September 13, 2011  
INVENTOR(S) : Kevin L. Beaman and John T. Moore Page 1 of 1

It is certified that error appears in the above-identified patent and that said Letters Patent is hereby corrected as shown below:

Column 3, line 46, "less than 50 last 10Å" should read --less than 50Å thick,--.

Column 3, line 47, insert the following before "above substrate 16" --and in particular embodiments is about 40Å thick. Preferably, an entirety of the nitrogen formed within layer 18 is at least 10Å--.

Column 8, line 49, "is a energy" should read --is a lower energy--.

Signed and Sealed this
Twenty-third Day of October, 2012

David J. Kappos
*Director of the United States Patent and Trademark Office*